United States Patent [19]

Li

[11] Patent Number: 4,730,169

[45] Date of Patent: Mar. 8, 1988

[54] INJECTION LOCKING AND TUNING CIRCUIT FOR MICROWAVE DIODE OSCILLATOR

[75] Inventor: Hsiu Y. Li, Sepulveda, Calif.

[73] Assignee: Hughes Aircraft Company, Los Angeles, Calif.

[21] Appl. No.: 895,982

[22] Filed: Aug. 14, 1986

[51] Int. Cl.⁴ .......................... H03B 9/14; H03L 7/24
[52] U.S. Cl. ................................... 331/36 C; 331/47; 331/107 DP; 331/107 C; 331/107 G; 331/177 V; 331/172
[58] Field of Search .............. 331/96, 107 DP, 107 C, 331/107 G, 47, 117 D, 172, 36 C, 177 V

[56] References Cited

U.S. PATENT DOCUMENTS

| | | | |
|---|---|---|---|
| 3,713,041 | 1/1973 | Sakamoto et al. | 331/44 |
| 4,206,421 | 6/1980 | Bernhardt et al. | 331/36 C X |
| 4,631,497 | 12/1986 | Braun | 331/36 C X |

Primary Examiner—Siegfried H. Grimm
Attorney, Agent, or Firm—Charles D. Brown; A. W. Karambelas

[57] ABSTRACT

A four-diode bridge is positioned within the cavity of a Gunn diode oscillator. A subharmonic signal is applied to the diode bridge and the diode bridge couples an odd harmonic of the injected signal into the cavity. The cavity is thus caused to resonate at the odd harmonic of the injected signal. The injected signal can be changed using a frequency synthesizer in order to provide a microwave oscillator with multiple-channel operation. The diode bridge provides a feedback signal indicative of the phase of cavity oscillation. The feedback signal is applied to a varactor which pretunes the Gunn diode oscillator and thereby provides phase-locked control.

20 Claims, 2 Drawing Figures

INJECTION LOCKING AND TUNING CIRCUIT FOR MICROWAVE DIODE OSCILLATOR

BACKGROUND OF THE INVENTION

1. Field of the Invention

The present invention relates generally to microwave oscillators. More particularly, the invention relates to a Gunn diode oscillator employing subharmonic locking by signal injection using a diode bridge. The diode bridge provides a feedback signal indicative of the phase of the cavity oscillation which can be used to provide a phase-locked oscillation.

2. Description of Related Art

In many microwave applications, solid state microwave oscillators are now being used. Many such oscillators use diodes, such as tunnel diodes, avalanche diodes and Gunn diodes, to generate the microwave signal. Typically, the diode is electromagnetically coupled to a tuned or resonant cavity. Tunnel diodes and avalanche diodes are junction semiconductors. They have one or more doped regions with junctions in between. In contrast, the Gunn diode is a bulk semiconductor without differently doped regions defining junctions. In general, all of these diodes are negative resistance devices. They can be used to generate microwave oscillations by coupling to a tuned cavity of high Q. Usually, the tuned cavity offers a positive resistance which is designed to cancel out the negative resistance of the diode. The impedance of the cavity is constructed to be the conjugate match of the diode reactance. By energizing the diode, microwave oscillations are set up in the cavity. The cavity may be coupled via an output port to a waveguide or the like, thereby affording a microwave oscillator which can be used in a wide variety of communications and radar applications, to name but two. Although junction semiconductors and bulk semiconductors can both be used, in general, bulk semiconductors are capable of higher power output and can be made to operate at higher frequencies.

In designing a microwave system, it is often desirable to have control over the frequency of the oscillation. In a multiple channel microwave transmitter, for example, it is desirable to be able to generate or synthesize a plurality of different channels or frequencies by shifting the oscillation frequency of the microwave oscillator. Some fairly complex circuits have been devised to accomplish this in conventional systems. Also, in many instances, it is highly desirable to have to microwave oscillations phase-locked to a more readily controlled low-frequency reference signal. However, conventional microwave oscillators have had great difficulty in providing a phase-locked signal.

In providing controlled microwave oscillations, it is known to inject a fundamental signal into the resonant cavity using either reflection injection with a three port circulator or direct injection with a probe, causing the frequency of the cavity oscillation to frequency lock or track with the injected signal. By controlling the frequency of the injected signal, the frequency of the microwave oscillation can be controlled. While providing a frequency-locked signal, this conventional approach does not provide a phase-locked signal. Moreover, the electronic circuit for developing the subharmonic injection requires a parasitic oscillating signal and an idler signal and is quite complex and expensive. In addition, when injecting the signal in this fashion, a plurality of multiples of the subharmonic signal will also be injected unless filtered out. This adds further to the complexity and expense in developing a workable microwave system.

In order to provide a phase-locked performance in a conventional system, a complex closed-loop sampling system is usually employed. Aside from adding considerably to the circuit complexity, sampling systems of this nature require several multipliers and usually some form of phase detector and integrator in the closed loop. Circuits of this type are traditionally quite slow in responding to channel or frequency changes. Hence, there can be a considerable delay before phase lock is achieved after a channel selection has been made.

SUMMARY OF THE INVENTION

The present invention overcomes the foregoing problems and provides a microwave oscillator which is inexpensive, accurate, and which may be readily frequency locked and phase-locked without complicated electronic circuitry. The oscillator is quite rapidly responsive to changes in injection frequency, making the oscillator well suited for multiple-channel, frequency-synthesized applications. The invention comprises a microwave oscillator having a cavity and an oscillator diode coupled to the cavity for producing microwave oscillations in the cavity. A four-diode bridge or quad diode is positioned in the cavity for frequency multiplication signal injection, and phase error detection.

The invention further comprises a means for applying a predetermined injection signal to the diode bridge for injection into the cavity. The injection signal cooperates with the oscillation in the cavity to control the frequency of those oscillations. Preferably, the oscillator diode is a Gunn diode and includes a varactor or equivalent means for pretuning the frequency of the oscillations produced by the Gunn diode. The diode bridge provides a low-frequency or DC feedback signal which is indicative of the phase of the cavity oscillations. This feedback signal can be coupled to the varactor pretuning circuit in order to achieve a phase-locked system. The diode bridge can be constructed to couple with TEM, TE and TM wave modes within the cavity. The diode bridge has the advantage of coupling only the odd harmonics of the injected signal into the cavity. By constructing the cavity with the appropriate resonance, only one of the odd harmonics is injected. This cooperation between the cavity and the diode bridge results in only one harmonic being injected into the cavity.

For a more complete understanding of the invention, its objects and advantages, reference may be had to the followed specification and to the accompanying drawings.

BRIEF DESCRIPTION OF THE DRAWINGS

FIG. 2 is a multiple-channel, digital frequency-synthesized oscillator employing the four-diode bridge of the invention.

DESCRIPTION OF THE PREFERRED EMBODIMENT

Figure 1:
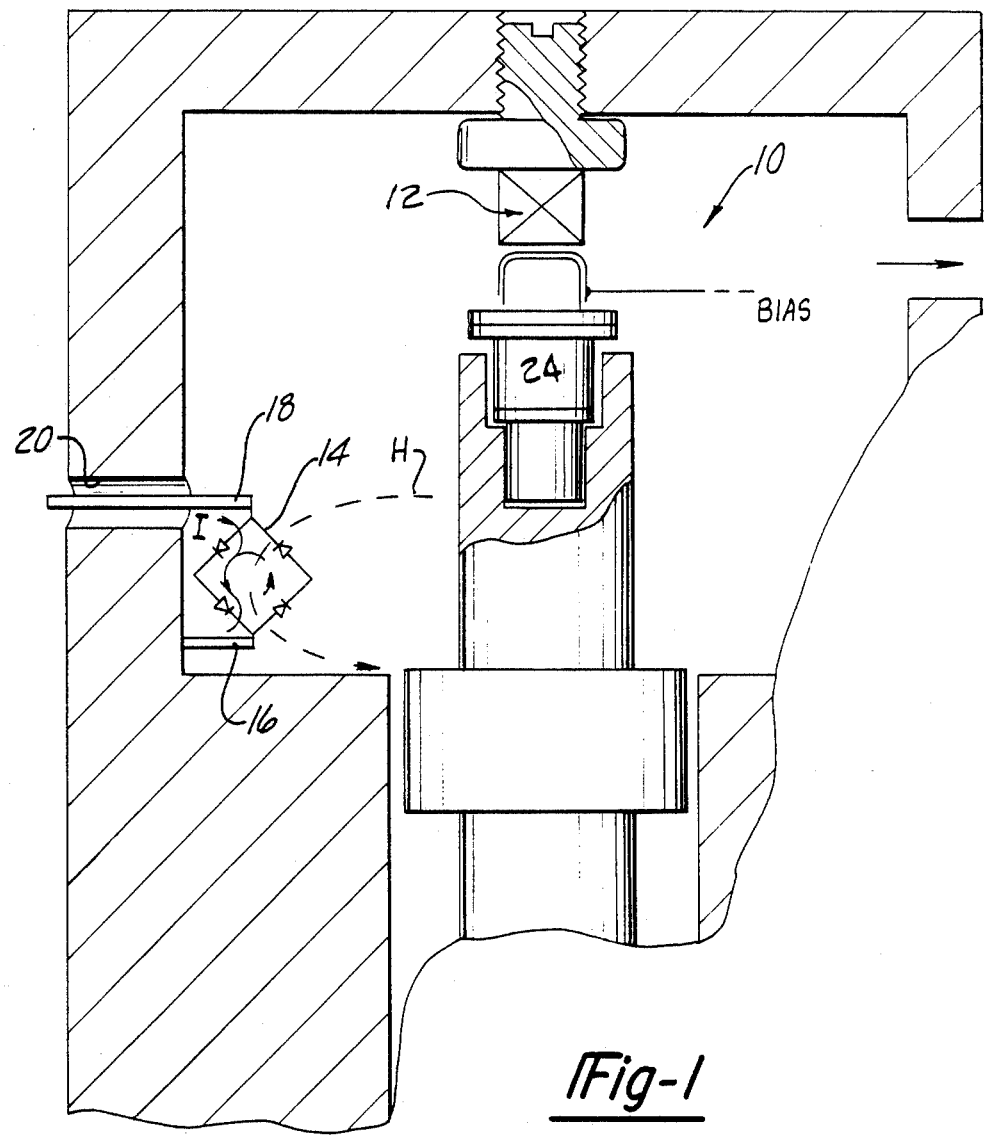
FIG. 1 is a cross-sectional perspective view of a microwave cavity with four-diode bridge signal injection and phase-detection circuit in accordance with the invention.

The present invention provides a greatly improved mechanism for generating a stable, programmable microwave RF source. The invention may be used to inject a subharmonic into the cavity of a diode oscillator, such as a Gunn oscillator. FIG. 1 illustrates a fragmentary portion of a Gunn oscillator cavity 10 having an oscillator diode or Gunn diode 12 mounted for electromagnetic coupling with the cavity. A four-diode bridge or quad diode 14 is positioned within cavity 10 for electromagnetic coupling with the cavity. The four-diode bridge may be implemented using hot carrier barrier diodes or gallium arsenide diodes, depending upon the subharmonic injection frequency selected. Diode bridge 14 has a first terminal 16 connected to the wall of cavity 10. A second terminal 18 passes through aperture 20 in the wall of cavity 10. Terminal 18 serves as the input terminal into which subharmonic signals are injected and from which a low-frequency or DC-phase detection feedback signal returns. When a subharmonic injection signal is applied to second terminal 18, even harmonics and the DC component from rectification are cancelled out due to anti-parallel matched diodes. Only the odd harmonic current flows out of the diode bridge circuit as illustrated by the path I. This circulating current launches a harmonic electromagnetic wave into cavity 10. In FIG. 1, the harmonic wave launched into the cavity is depicted by the dashed line labeled H. Depending on the positioning of the diode bridge, and depending on the geometry of the cavity, odd harmonics of the injected signal can be made to couple to the TEM wave mode, to the TM wave mode and to the TE wave mode. The TEM wave mode coupling is depicted in FIG. 1.

Referring now to FIG. 2, a digital frequency-synthesized oscillator employing the principles of the invention is illustrated. As shown, the oscillator includes cavity 10 with Gunn diode 12 and four-diode bridge 14 as more fully described above. Cavity 10 includes an output aperture 22 through which the output microwave energy exits. The output aperture 22 may be connected to a waveguide or the like for piping the energy to the microwave circuit or antenna (not shown). Coupled to Gunn diode 12 is a varactor 24 which pretunes the frequency of the Gunn diode oscillations.

In order to provide a readily selectable subharmonic injection signal, a digital frequency synthesizer circuit 26 is provided. Frequency synthesizer circuit 26 employs a low frequency oscillator 28, e.q., 500 MHz. The low frequency oscillator feeds a multiplier 30 and a numerical division circuit 32. Multiplier 30 steps up the frequency to a higher reference frequency, e.g., 3 GHz. Division circuit 32 divides the low frequency oscillator frequency by a number selected from a range of numbers, used to produce the frequency selection. The desired number is selected by a digital control signal indicative of the desired frequency on lead 31.

The output of division circuit 32 is fed to the R terminal of a first mixer 34. The L input terminal of mixer 34 is coupled directly to the low frequency oscillator 28. As is well known in the art, a mixer produces signals have sum and difference frequencies of the input signals applied. The "+" signs in the mixer symbol 34 conventionally designate mixer 34 as producing an output on its I terminal having a frequency equal to the sum of the respective frequencies of its input signals at its R and L terminals (the difference frequency signal being suitably suppressed by an appropriate filter, not shown). The output signal of mixer 34 is then stepped up at digitally controlled multiplier 36, and the undesirable intermodulation products are removed by a programmable band pass filter whose center frequency is determined in accordance with the digital control signal on lead 31 (the programmable band pass filter not being separately shown from multiplier 36). The output of multiplier 36 can thus cover a range of values determined by a range of divisors supplied by division circuit 32.

A second mixer 38 is coupled at its R terminal to the multiplier 36 and is coupled at its L terminal to multiplier 30. Second mixer 38 provides an output on the I terminal which is the difference of its R and L inputs (I=L−R). Depending on the divisor N selected in division circuit 32, the output of mixer 38 will be in the range of 1.8 GHz. to 1.898734 GHz., assuming the nominal values previously stated. The output of mixer 38 is a subharmonic of the desired cavity oscillation frequency.

The subharmonic signal is amplified in filter amplifier circuit 40, and the amplified signal is fed through a circulator via its high-pass terminal HP to the second terminal 18 of diode bridge 14. Circulator 42 is a unidirectional device which permits the low frequency phase error signal to flow in and the high frequency injected subharmonic to flow out to diode 14, but which prevents microwave signals from feeding back into the filter amplifier 40. Circulator 42 further includes a low-pass terminal LP which supports a low-frequency or DC feedback current flow $I_f$ in the direction indicated in FIG. 2.

As previously stated, diode bridge 14 generates a low frequency or DC signal whose amplitude is indicative of the phase of the oscillation in the cavity. Circulator 42 permits this phase detection signal to feedback to the control circuit 44 which is coupled to the varactor 24. Varactor 24 pretunes the Gunn diode oscillation, and the phase detection feedback signal on the LP lead of circulator 42 permits the oscillation of Gunn diode 12 to be phase locked to the low frequency oscillator 28. More specifically, control circuit 44 includes an integrator for processing the phase detection feedback signal and also includes a digital-to-analog converter 48 which is coupled to the digital frequency synthesizer circuit 26 and which provides an analog signal indicative of the desired frequency based on the digital control signal on lead 31. The output of integrator 46 is supplied on lead 47 to one terminal of varactor 24. DC bias is applied to the other terminal of varactor 24 via terminal 50. This analog signal coarsely pretunes the cavity to the desired frequencies resulting in a wider frequency lock range and higher power conversion efficiency.

The operational amplifier of integrator 46 has its input offset voltage adjusted in accordance with the signal generated at potentiometer 49 at the output of digital-to-analog converter 48. The movable contact of the potentiometer is coupled at lead 51 to an offset-adjusting terminal of the operational amplifier of integrator 46. This offset adjustment enables relatively fast changing of operation from one frequency channel to another to pretune varactor diode 24 to approximately the newly desired operational frequency of the microwave oscillator. An operational amplifier having a conventional offset-voltage adjusting terminal is, for example, the OP-37, commercially available form PMI.

In operation, the digital frequency synthesizer supplies a subharmonic signal at a frequency determined by the divisor N. In addition to producing the subharmonic, the frequency synthesizer also naturally produces both even and odd harmonics of the selected subharmonic. In conventional oscillators, this natural production of higher order even and odd harmonics has required the use of complex and expensive filters to extract the desired harmonic while suppressing the rest. This has been necessary in conventional oscillators because the conventional single-diode injection circuit is low power and coupled all harmonics to the cavity, therby permitting undesired frequencies to be launched.

The four-diode bridge of this invention vastly improves the situation. The diode bridge couples only the odd harmonics to the cavity. The even harmonics are automatically suppressed. Accordingly, by constructing the cavity and Gunn diode properly, the cavity can be made to resonate at one of these odd harmonics, without resonating at the others.

The cavity size can be such that the fifth harmonic of the injected subharmonic is supported. In this instance, the subharmonic frequency is multiplied by a factor of five. In the example given above, where the subharmonic is in a range of 1.80 to 1.898734 GHz., the output microwave oscillation is in the range of 9.0 to 9.49367 GHz. If lower frequencies are desired, the cavity can be constructed to resonate at the third harmonic, in which case the output frequency would be in a range from 5.40 to 5.696 GHz. Other odd harmonics are also usable.

Since the even harmonics are suppressed by the diode bridge, the cavity will not produce undesired oscillations at those frequencies. Also, because the even harmonics are suppressed by the diode bridge, the high Q resonant cavity 10 cooperates with the diode bridge to select and oscillate at only the desired frequency as pretuned by the varactor through D/A 48. The invention is thus capable of a wide-frequency lock range and very low injection power requirements. Because many of the filters can be eliminated, the invention operates at a higher efficiency than conventional oscillators.

Another advantage of the invention results from the diode bridge providing a feedback signal indicative of the phase of the cavity oscillation. In conventional oscillators, a separate RF coupler is often used to extract a signal indicative of the phase of the cavity oscillation. Conventional oscillators must process the extracted signal through several mixing and multiplying stages in order to provide a usable signal for phase-locked, closed-loop control. The circuits used to accomplish this are generally slow to respond to frequency changes, resulting in an oscillator which cannot be rapidly switched from channel to channel.

In the present invention, the diode bridge serves a dual purpose. In addition to signal multiplication and injection, diode bridge 14 generates a DC feedback signal indicative of the phase difference between the injected signal and the cavity oscillation. This feedback signal is integrated in integrator 46 to provide a biasing signal to varactor 24. The varactor, in turn, fine tunes the Gunn oscillator diode, effecting phase-locked control in the process. The oscillator of the invention can be quickly switched from channel to channel, with frequency lock and phase lock being rapidly re-established.

While the invention has been described in connection with its presently preferred embodiment, it will be understood that the invention is capable of certain modification and change without departing from the spirit of the invention as set forth in the appended claims.

What is claimed is:

1. A microwave oscillator comprising:
   a cavity;
   an oscillator diode coupled to said cavity for producing microwave oscillations in said cavity;
   a four-diode bridge positioned in said cavity for injecting signals into said cavity; and
   a means for applying a predetermined injection signal to said diode bridge for injection into said cavity, said injection signal cooperating with said oscillations in said cavity to control the frequency of said oscillations.

2. The oscillator of claim 1 wherein said oscillator diode is Gunn diode.

3. The oscillator of claim 1 wherein said oscillator includes means for pretuning the frequency of said oscillations.

4. The oscillator of claim 1 wherein said oscillator diode is a Gunn diode and further comprising varactor pretuning means coupled to said oscillator diode for pretuning the frequency of said oscillations.

5. The oscillator of claim 1 wherein said cavity supports a TE wave mode and said diode bridge is positioned to couple with said TE wave mode.

6. The oscillator of claim 1 wherein said cavity supports a TM wave mode and said diode bridge is positioned to couple with said TM wave mode.

7. The oscillator of claim 1 wherein said cavity support a TEM wave mode and said diode bridge is positioned to couple with said TEM wave mode.

8. The oscillator of claim 1 wherein said cavity is defined by a cavity wall, said cavity wall including an aperture, wherein said diode bridge has a first terminal connected to said cavity wall and a second terminal passing through said aperture and coupled to said means for applying a predetermined injection signal.

9. The oscillator of claim 1 wherein said diode bridge produces a feedback signal indicative of the phase of said oscillations and further comprising pretuning means receptive of said feedback signal for controlling the phase of said oscillations.

10. The oscillator of claim 1 wherein said injection signal is a subharmonic of said oscillations.

11. The oscillator of claim 1 wherein oscillations are at an oscillation frequency and said injection signal comprises a plurality of subharmonics of said oscillation frequency.

12. The oscillator of claim 11 wherein said diode bridge injects one of said plurality of subharmonics into said cavity.

13. The oscillator of claim 11 wherein said plurality of subharmonics includes an odd subharmonic and said bridge injects said odd subharmonic into said cavity.

14. The oscillator of claim 13 wherein said odd subharmonic is the third subharmonic.

15. The oscillator of claim 13 wherein said odd subharmonic is the fifth subharmonic.

16. A microwave oscillator comprising:
   a cavity;
   a Gunn diode electromagnetically coupled to said cavity for producing microwave oscillations in said cavity at an oscillation frequency;
   a four-diode bridge positioned in said cavity and electromagnetically coupled to said cavity for injecting signals into said cavity;
   a means for generating a predetermined injection signal containing a plurality of subharmonics of said oscillation frequency;
   said diode bridge being coupled to said generating means for receiving said subharmonics and being cooperative with said cavity to inject one of said subharmonics into said cavity;

said diode bridge providing a feedback signal indicative of the phase of said oscillations; and means coupled between said diode bridge and said Gunn diode for pretuning the oscillation produced by said Gunn diode;

wherein said injection signal is cooperative with said oscillations in said cavity to control said oscillation frequency and said feedback signal is cooperative with said oscillations to control the phase of said oscillations.

17. A method of operating a microwave oscillator comprising:

providing an oscillator cavity;

coupling an oscillator diode to said cavity so that microwave oscillations are produced in said cavity;

positioning a four diode bridge in said cavity;

applying a predetermined injection signal to said diode bridge, so that the injection signal is injected into the cavity; and controlling the frequency of said oscillations with said injection signal.

18. The method of claim 17 further comprising the steps of:

obtaining a feedback signal from said diode bridge indicative of the phase of said oscillations;

controlling the phase of said oscillations with said feedback signal.

19. The method of claim 18 wherein said oscillations are at an oscillation frequency and said injection signal comprises a plurality of subharmonics of said oscillation frequency.

20. The method of claim 19 wherein said plurality of subharmonics includes an odd subharmonic and said diode bridge injects said odd subharmonic into said cavity.

* * * * *